(12) United States Patent
Chiang et al.

(10) Patent No.: US 8,470,419 B2
(45) Date of Patent: *Jun. 25, 2013

(54) ELECTRONIC DEVICE HOUSING AND METHOD FOR MAKING THE SAME

(75) Inventors: Chwan-Hwa Chiang, Taipei Hsien (TW); Qi-Jian Du, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 93 days.

This patent is subject to a terminal disclaimer.

(21) Appl. No.: 12/949,934

(22) Filed: Nov. 19, 2010

(65) Prior Publication Data

US 2011/0159258 A1    Jun. 30, 2011

(30) Foreign Application Priority Data

Dec. 28, 2009   (CN) .......................... 2009 1 0312423

(51) Int. Cl.
*A47G 19/22* (2006.01)
(52) U.S. Cl.
USPC ........................................ 428/34.4; 428/34.6

(58) Field of Classification Search
USPC ................ 428/213, 336, 34.4, 34.6; 106/436; 204/192.16
See application file for complete search history.

(56) References Cited

U.S. PATENT DOCUMENTS

| | | | | |
|---|---|---|---|---|
| 1,781,003 | A * | 11/1930 | Fehr | 62/519 |
| 2,792,287 | A * | 5/1957 | Moore, Jr. et al. | 501/86 |
| 6,653,356 | B2 * | 11/2003 | Sherman | 516/90 |
| 7,225,831 | B2 * | 6/2007 | Hope et al. | 137/516.27 |
| 8,097,344 | B2 * | 1/2012 | Chiang et al. | 428/469 |
| 2002/0005145 | A1 * | 1/2002 | Sherman | 106/436 |
| 2004/0120884 | A1 * | 6/2004 | Sherman | 423/608 |
| 2011/0095242 | A1 * | 4/2011 | Jin et al. | 252/583 |
| 2011/0159258 | A1 * | 6/2011 | Chiang et al. | 428/213 |

* cited by examiner

*Primary Examiner* — N. Edwards
(74) *Attorney, Agent, or Firm* — Altis Law Group, Inc.

(57) ABSTRACT

An electronic device housing includes a substrate and a nano titanium dioxide coating formed on the substrate is provided. The nano titanium dioxide coating has a thickness of about 10-100 nm. The nano titanium dioxide coating is formed of rutile crystals or composite crystals formed of rutile and anatase. A method for making the electronic device is also described there.

6 Claims, 1 Drawing Sheet

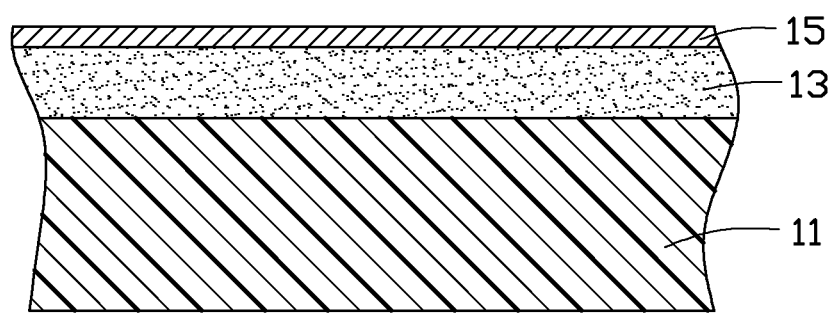

ELECTRONIC DEVICE HOUSING AND METHOD FOR MAKING THE SAME

CROSS-REFERENCE TO RELATED APPLICATIONS

This application is one of the three related co-pending U.S. patent applications listed below. All listed applications have the same assignee. The disclosure of each of the listed applications is incorporated by reference into all the other listed applications.

| application No. | Pat. No. | Title | Inventors |
| --- | --- | --- | --- |
| 12/949,934 | — | ELECTRONIC DEVICE HOUSING AND METHOD FOR MAKING THE SAME | QI-JIAN DU et al. |
| 12/949,942 | 8097344 | ELECTRONIC DEVICE HOUSING | QI-JIAN DU et al. |
| 12/949,947 | — | ELECTRONIC DEVICE HOUSING | QI-JIAN DU et al. |

BACKGROUND

1. Technical Field

The present disclosure relates to electronic device housings, particularly to an electronic device housing having self-cleaning property and a method for making the electronic device housing.

2. Description of Related Art

Decorative metallic coatings are often formed on housings of electronic devices. The metallic coatings are typically formed by vacuum deposition to present an aesthetic metallic appearance. Metallic coatings formed by vacuum deposition can be nonconductive so as not to block electromagnetic waves. However, the metallic coatings are not self-cleaning, and cannot repel dust and sweat that collects on the electronic device housings.

Therefore, there is room for improvement within the art.

BRIEF DESCRIPTION OF THE FIGURE

Many aspects of the electronic device housing can be better understood with reference to the following FIGURE. The components in the FIGURE are not necessarily drawn to scale, the emphasis instead being placed upon clearly illustrating the principles of the electronic device housing.

The FIGURE is a cross-section of an exemplary embodiment of an electronic device housing.

DETAILED DESCRIPTION

The FIGURE shows an electronic device housing 10 according to an exemplary embodiment. The electronic device housing 10 includes a substrate 11, a base paint coating 13 formed on a surface of the substrate 11, and a nano titanium dioxide coating 15 formed on the base paint coating 13. The electronic device housing 10 may be a housing of mobile phone, PDA, note book computer, MP3, MP4, GPS navigator, or digital camera.

The substrate 11 may be formed by molding one or more plastic materials selected from a group consisting of polycarbonate (PC), polyethylene (PE), polymethyl methacrylate (PMMA), and a mixture of polycarbonate and acrylonitrile-butadiene-styrene plastics (PC+ABS). The substrate 11 may also be made of glass or ceramic.

The base paint coating 13 may be an acrylic resin paint coating, an epoxy resin paint coating, a polyurethane resin paint coating, or a phenolic resin paint coating. The base paint coating 13 may have a thickness of about 1 μm to about 30 μm. The base paint coating 13 can be colored or transparent. The base paint coating 13 enhances the bonding between the substrate 11 and the nano titanium dioxide coating 15.

The nano titanium dioxide coating 15 may be formed on the base paint coating 13 by vacuum sputtering. The nano titanium dioxide coating 15 is formed of rutile crystals, or composite crystals formed of rutile and anatase. The thickness of the nano titanium dioxide coating 15 may be in a range of about 10-100 nm. The thickness of the nano titanium dioxide coating 15 is controlled to present a metallic appearance for the electronic device housing 10 without interfering with radio transmission capabilities. The nano titanium dioxide coating 15 further has a self-cleaning property. Specifically, dust and sweat may attach on the surface of the nano titanium dioxide coating 15. However, during irradiation under visible light or ultraviolet light, the nano titanium dioxide coating 15 can oxygenize and clean off dust and sweat.

The base coating 13 is used as a bonding agent between the nano titanium dioxide coating 15 and the substrate 11 but may be omitted in applications that allows a bond to be formed by directly applying the nano titanium dioxide coating 15 on the substrate 11.

A method for making the electronic device housing 10 may include the following steps.

The substrate 11 is provided. The substrate 11 may be made of plastic material, glass, or ceramic.

The base paint coating 13 is sprayed on the substrate 11. The paint for forming the base paint coating 13 may be acrylic resin paint, epoxy resin paint, polyurethane resin paint, or phenolic resin paint. Before forming the base paint coating 13, the surface of the substrate 11 may be cleaned by plasma.

The nano titanium dioxide coating 15 is formed on the base paint coating 13 by vacuum sputtering. Vacuum sputtering of the nano titanium dioxide coating 15 may be implemented by a vacuum depositing machine. The vacuum depositing machine may be vacuum pumped to about $1\times10^{-3}$ Pa and receives the substrate 11. Then the vacuum depositing machine continues to be vacuum pumped to about $5\times10^{-4}\sim9\times10^{-4}$ Pa. Oxygen gas ($O_2$, having a purity of about 99.99%) and argon gas (Ar) are introduced into the vacuum depositing machine to get a pressure of about 0.05~0.29 Pa with the pressure of the $O_2$ being in a range of about 0.01~0.225 Pa. The target material for vacuum sputtering the nano titanium dioxide coating 15 may be titanium. The output power of the target may be 3000~4000 watt (W). During the vacuum sputtering process, the argon gas converts into plasma and strikes the titanium target to make the titanium target generate titanium atoms. These titanium atoms then immediately react with the oxygen gas to form the nano titanium dioxide coating 15 on the base paint coating 13. The deposition rate of the nano titanium dioxide coating 15 is about 0.3-0.5 nm/s.

It is to be understood that before forming the nano titanium dioxide coating 15, the base paint coating 13 may undergo plasma cleaning.

It should be understood, however, that though numerous characteristics and advantages of the present embodiments have been set forth in the foregoing description, together with details of functions of the embodiments, the disclosure is illustrative only, and changes may be made in detail within the principles of the disclosure to the full extent indicated by the broad general meaning of the terms in which the appended claims are expressed.

What is claimed is:

1. An electronic device housing, comprising:
   a substrate; and
   a nano titanium dioxide coating having a thickness of about 10-100 nm formed on the substrate, the nano titanium dioxide coating being formed of rutile crystals or composite crystals formed of rutile and anatase.

2. The electronic device housing as claimed in claim 1, wherein the substrate is made of plastic material, glass or ceramic.

3. The electronic device housing as claimed in claim 1, wherein the nano titanium dioxide coating is formed by vacuum sputtering.

4. The electronic device housing as claimed in claim 1, further comprising a base paint coating formed between the substrate and the nano titanium dioxide coating.

5. The electronic device housing as claimed in claim 4, wherein the base paint coating is an acrylic resin paint coating, an epoxy resin paint coating, a polyurethane resin paint coating, or a phenolic resin paint coating.

6. The electronic device housing as claimed in claim 4, wherein the base paint coating has a thickness of about 1-30 μm.

* * * * *